United States Patent
Sakurai et al.

(10) Patent No.: US 7,608,368 B2
(45) Date of Patent: Oct. 27, 2009

(54) PATTERN FORMING METHOD, PHOTOMASK MANUFACTURING METHOD, SEMICONDUCTOR DEVICE MANUFACTURING METHOD, AND COMPUTER PROGRAM PRODUCT

(75) Inventors: Hideaki Sakurai, Yokohama (JP); Tooru Shibata, Kawasaki (JP); Masato Saito, Machida (JP); Masamitsu Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 569 days.

(21) Appl. No.: 11/342,677

(22) Filed: Jan. 31, 2006

(65) Prior Publication Data

US 2006/0172205 A1    Aug. 3, 2006

(30) Foreign Application Priority Data

Jan. 31, 2005    (JP) .............................. 2005-024142

(51) Int. Cl.
*G03F 9/00*    (2006.01)
*G03C 5/00*    (2006.01)

(52) U.S. Cl. .............................. 430/5; 430/30; 430/296; 430/313; 430/323; 430/330; 430/331; 430/942

(58) Field of Classification Search ...................... 430/5, 430/30, 296, 310, 313, 323, 330, 331, 942; 396/604, 611, 626, 627; 216/83, 96; 156/345.11, 156/345.13, 345.17; 438/745
See application file for complete search history.

(56) References Cited

U.S. PATENT DOCUMENTS

| 6,550,990 B2 | 4/2003 | Sakurai et al. |
| 6,929,903 B2 | 8/2005 | Itoh et al. |
| 2005/0242062 A1 | 11/2005 | Sakurai et al. |

FOREIGN PATENT DOCUMENTS

JP    2002-252167    9/2002

*Primary Examiner*—Christopher G Young
(74) *Attorney, Agent, or Firm*—Finnegan, Henderson, Farabow, Garrett & Dunner, L.L.P.

(57) ABSTRACT

A pattern forming method includes developing a resist film on a main surface of a substrate by flowing a developing solution on the film to form a resist pattern, the developing the film including partitioning the surface into M ($\geq 2$) regions and determining correction exposure dose for each of the M region, the determining the correction exposure dose including determining a correction exposure dose for an i-th ($1 \leq i \leq M$) region so that an actual pattern dimension of a pattern on the i-th region matches a design pattern dimension based on a pattern opening ratio of a pattern to be formed on the substrate, the pattern being located on a region which is further upstream region than the i-th region with respect to an upstream direction of a flow of the solution, and forming the pattern by etching the substrate using the resist pattern as a mask.

16 Claims, 9 Drawing Sheets

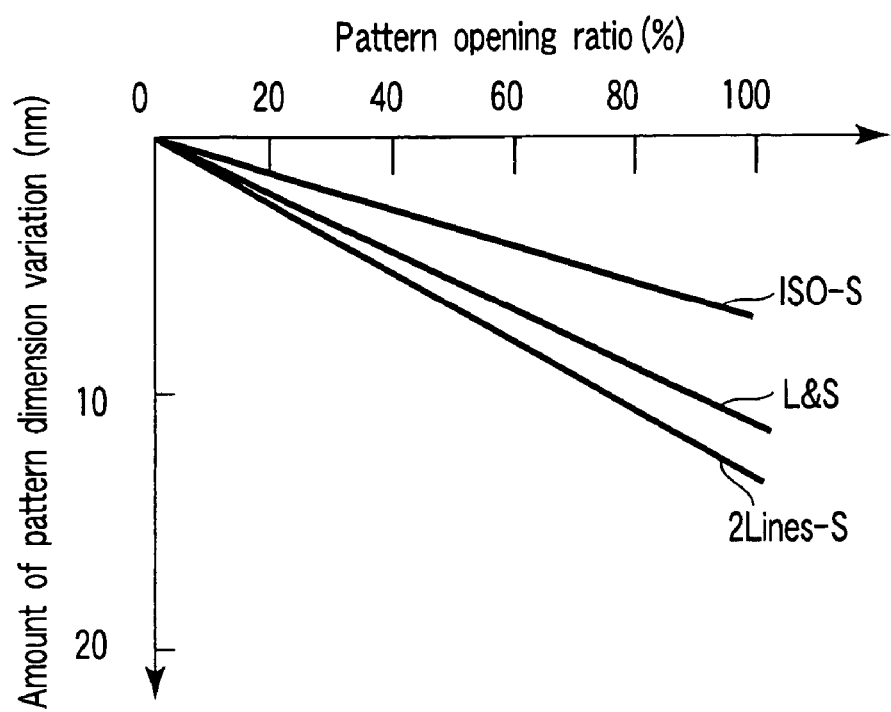
F I G. 7
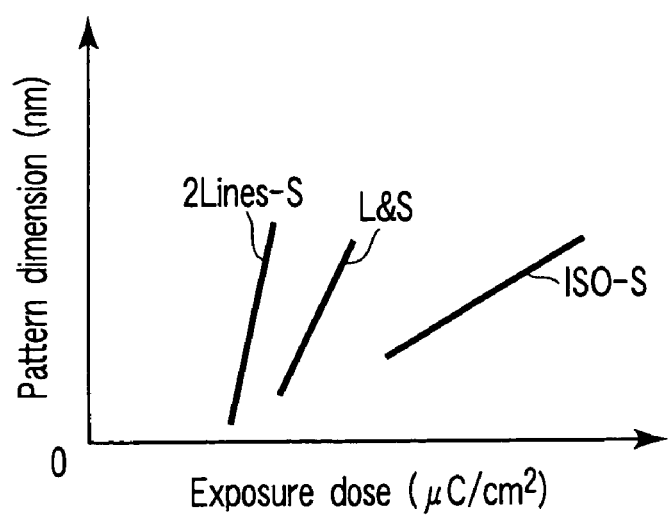
F I G. 8

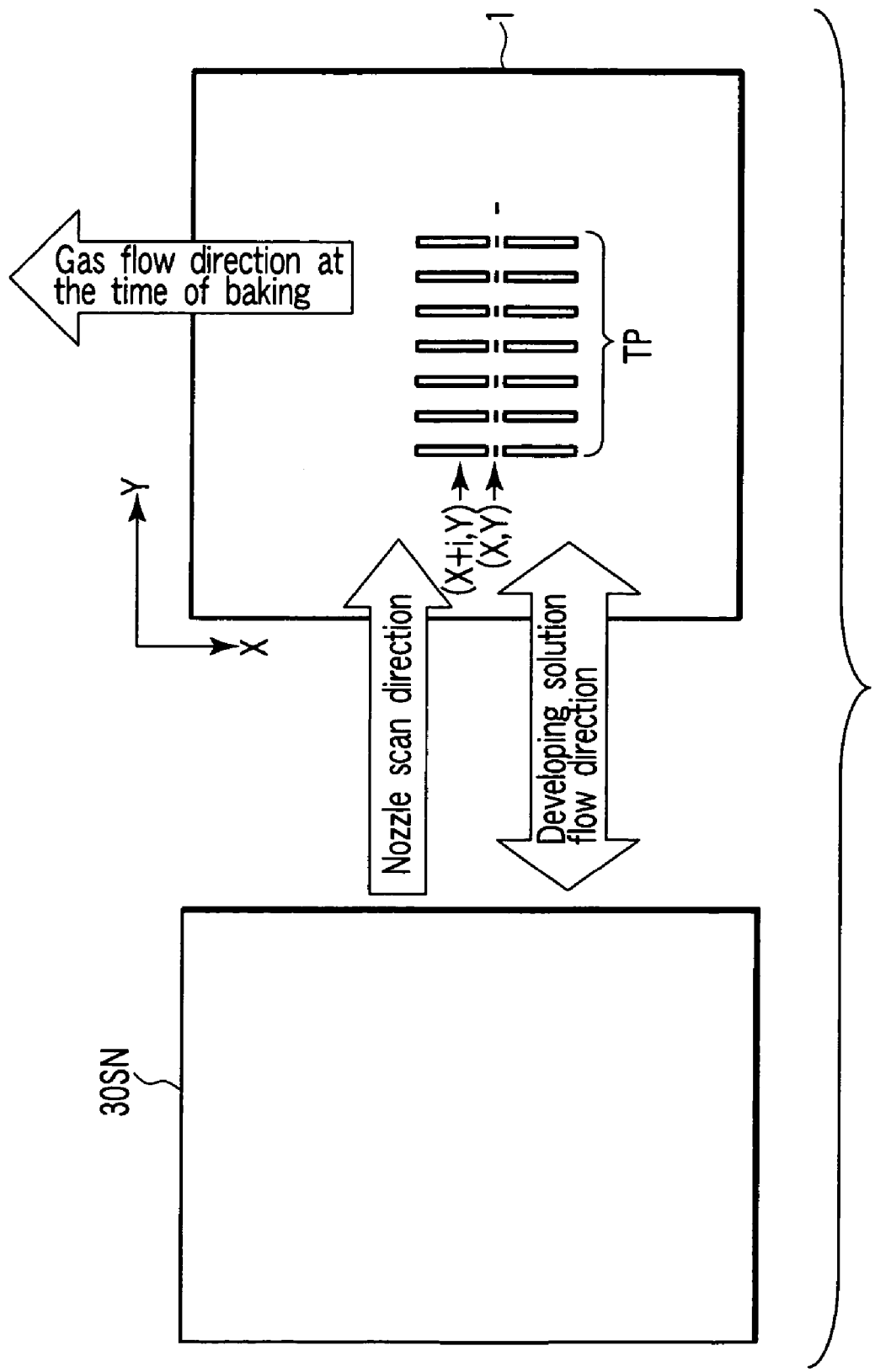
F I G. 12

PATTERN FORMING METHOD, PHOTOMASK MANUFACTURING METHOD, SEMICONDUCTOR DEVICE MANUFACTURING METHOD, AND COMPUTER PROGRAM PRODUCT

CROSS-REFERENCE TO RELATED APPLICATIONS

This application is based upon and claims the benefit of priority from prior Japanese Patent Application No. 2005-024142, filed Jan. 31, 2005, the entire contents of which are incorporated herein by reference.

BACKGROUND OF THE INVENTION

1. Field of the Invention

The present invention relates to a pattern forming method for forming patterns in devices, such as semiconductor devices and liquid crystal devices, a photomask manufacturing method, a semiconductor device manufacturing method, and a computer program product.

2. Description of the Related Art

Wet process is widely used as a substrate processing technique in the manufacturing process for semiconductor devices and liquid crystal displays. Especially, a splay method is positively studied as a development treatment after a photosensitive resin is exposed.

In a conventional splay method, chemical is supplied onto a substrate to be processed with the substrate is being rotated. The chemical is supplied by a chemical supply section disposed above the substrate.

However, with the chemical supply section, it is very difficult to uniform a discharge pressure of the chemical or a supply amount of the chemical per unit area both on central portion and peripheral portion. Therefore, it is very difficult to obtain uniform in-plane development accuracy on the substrate. Such the process accuracy problem similarly occurs in substrate processing other than the development processing.

In addition, as the development proceeds, dissolution products, low density developing solution, and the like occur as by-products. Generally, the dissolution products and low density developing solution, and the like are considered to have the effect of inhibiting dissolution of a photosensitive thin film. Since the dissolution products occur corresponding to the pattern density on the substrate, consequently, the dissolution products is made to have some distribution on the substrate. Thereafter, the dissolution products receive forces such as centrifugal forces generated by the rotation of the substrate, therefore the dissolution products do not move uniformly on the substrate. Even by such the reason, the in-plane uniform process accuracy cannot be obtained by the conventional spray method.

A substrate processing method using a suction nozzle to generate a chemical flow during the development is proposed. For example, there is proposed a nozzle having a chemical discharge opening and a chemical suction opening, and a substrate processing method using the nozzle (see Jpn. Pat. Appln. KOKAI Publication No. 2002-252167, for example).

When a developing solution is used as the chemical, i.e., the developing solution is discharged from the developing solution discharge opening while the developing solution is sucked from a developing solution suction opening, the substrate processing method is relating to a method that the substrate is processed by scanning the substrate with the nozzle which is positioned near the substrate. And the substrate processing method is such a method to realize chemical replacement between the patterns, furthermore to reduce pattern dimension difference resulting from the pattern density by positioning the nozzle near the substrate and accelerating the chemical flow on the substrate.

However, even in such the substrate processing method, it is still difficult to suppress development inhibition (development loading effect) caused by dissolution products (development by-products) and to sufficiently suppress CD variation.

In the case of the development process including the substrate rotation, flow rate and flow direction of the dissolution products are not uniform within the plane. This makes it very difficult to correct the dimension variation due to the dissolution products at exposure process by using the same function on the whole plane, therefore causing a problem that the CDs vary over the plane.

In addition, according to post-exposure baking (PEB), for example, if a chemically amplified resist is used as the photosensitive resin, acid generated by exposure process during PEB evaporates depending on the intensity and direction of an atmospheric flow (gas flow) in a baker. The evaporated acid deposits on the resist again or enter into the resist again. Such the re-deposition or re-entrance of the acid results in sensitivity variation and the resist is influenced to the extent that the pattern dimension changes.

BRIEF SUMMARY OF THE INVENTION

According to an aspect of the present invention, there is provided a pattern forming method comprising: forming a resist film on a main surface of a substrate; exposing the resist film to form a latent image of pattern on the resist film; developing the resist film by flowing a developing solution on the resist film to form a resist pattern which is formed of the resist film, the developing the resist film comprising partitioning the main surface of the substrate into M ($\geq 2$) regions and determining correction exposure dose for each of the M region, the determining the correction exposure dose including determining a correction exposure dose for an i-th ($1 \leq i \leq M$) region so that an actual pattern dimension of a pattern on the i-th region matches a design pattern dimension based on a pattern opening ratio of a pattern to be formed on the substrate, the pattern to be formed on the substrate being located on a region which is further upstream region than the i-th region with respect to an upstream direction of a flow of the developing solution; and forming the pattern on the substrate by etching the substrate using the resist pattern as a mask.

According to an aspect of the present invention, there is provided a photomask manufacturing method comprising: preparing a substrate including a light shield film on which a resist film is formed, the light shield film being formed on a main surface of the substrate; exposing the resist film to form a latent image of pattern on the resist film; developing the resist film by flowing a developing solution on the resist film to form a resist pattern which is formed of the resist film, the developing the resist film comprising partitioning the main surface of the substrate into M ($\geq 2$) regions and determining correction exposure dose for each of the M region, the determining the correction exposure dose including determining a correction exposure dose for an i-th ($1 \leq i \leq M$) region so that an actual pattern dimension of a pattern on the i-th region matches a design pattern dimension based on a pattern opening ratio of a pattern to be formed on the substrate, the pattern to be formed on the substrate being located on a region which is further upstream region than the i-th region with respect to an upstream direction of a flow of the developing solution;

and forming the pattern on the substrate by etching the substrate using the resist pattern as a mask.

According to an aspect of the present invention, there is provided a semiconductor device manufacturing method comprising: preparing a substrate including a semiconductor substrate forming a resist pattern on the substrate by a lithography process using a photomask, a manufacturing method of the photomask comprising preparing a substrate including a transparent substrate and a light shield film formed on the transparent substrate; forming a pattern being formed of the light shield film by a pattern forming method, the pattern forming method comprising forming a resist film on a main surface of a substrate; exposing the resist film to form a latent image of pattern on the resist film; developing the resist film by flowing a developing solution on the resist film to form a resist pattern which is formed of the resist film, the developing the resist film comprising partitioning the main surface of the substrate into M ($\geq 2$) regions and determining correction exposure dose for each of the M region, the determining the correction exposure dose including determining a correction exposure dose for an i-th ($1 \leq i \leq M$) region so that an actual pattern dimension of a pattern on the i-th region matches a design pattern dimension based on a pattern opening ratio of a pattern to be formed on the substrate, the pattern to be formed on the substrate being located on a region which is further upstream region than the i-th region with respect to an upstream direction of a flow of the developing solution; and forming the pattern on the substrate by etching the substrate using the resist pattern as a mask.

According to an aspect of the present invention, there is provided a computer program product configured to store program instructions for execution on a computer system enabling the computer system to perform an instruction for determining an exposure dose of a resist film in a pattern forming method, the pattern forming method comprising forming a resist film on a main surface of a substrate; exposing the resist film to form a latent image of pattern on the resist film; developing the resist film by flowing a developing solution on the resist film to form a resist pattern which is formed of the resist film; and forming the pattern on the substrate by etching the substrate using the resist pattern as a mask; the instruction for determining exposure dose including an instruction for partitioning the main surface of the substrate into M ($\geq 2$) regions, and an instruction for determining a correction exposure dose for an i-th ($1 \leq i \leq M$) region so that an actual pattern dimension of a pattern on the i-th region matches a design pattern dimension based on a pattern opening ratio of a pattern to be formed on the substrate, the pattern to be formed on the substrate being located on a region which is further upstream region than the i-th region with respect to an upstream direction of a flow of the developing solution.

BRIEF DESCRIPTION OF THE SEVERAL VIEWS OF THE DRAWING

FIG. 7 is a diagram showing relationship between opening ratio and pattern dimension variation amount;

FIG. 8 is a diagram showing relationship between exposure dose and pattern dimension;

FIG. 12 is a view showing relationship between an airflow direction on a substrate to be processed at the time of baking and a flow direction of a developing solution on the substrate at the time of development;

DETAILED DESCRIPTION OF THE INVENTION

Hereinafter, embodiments according to the present invention will be explained with reference to the accompanying drawings.

First Embodiment

In the present embodiment, a detailed description will be provided with reference to an example in which variation error due to loading effect which occurs at the time of development is reduced by correcting amount of an irradiation dose (exposure dose) of an electron beam which irradiates a resist film applied on a photomask.

Figure 1:
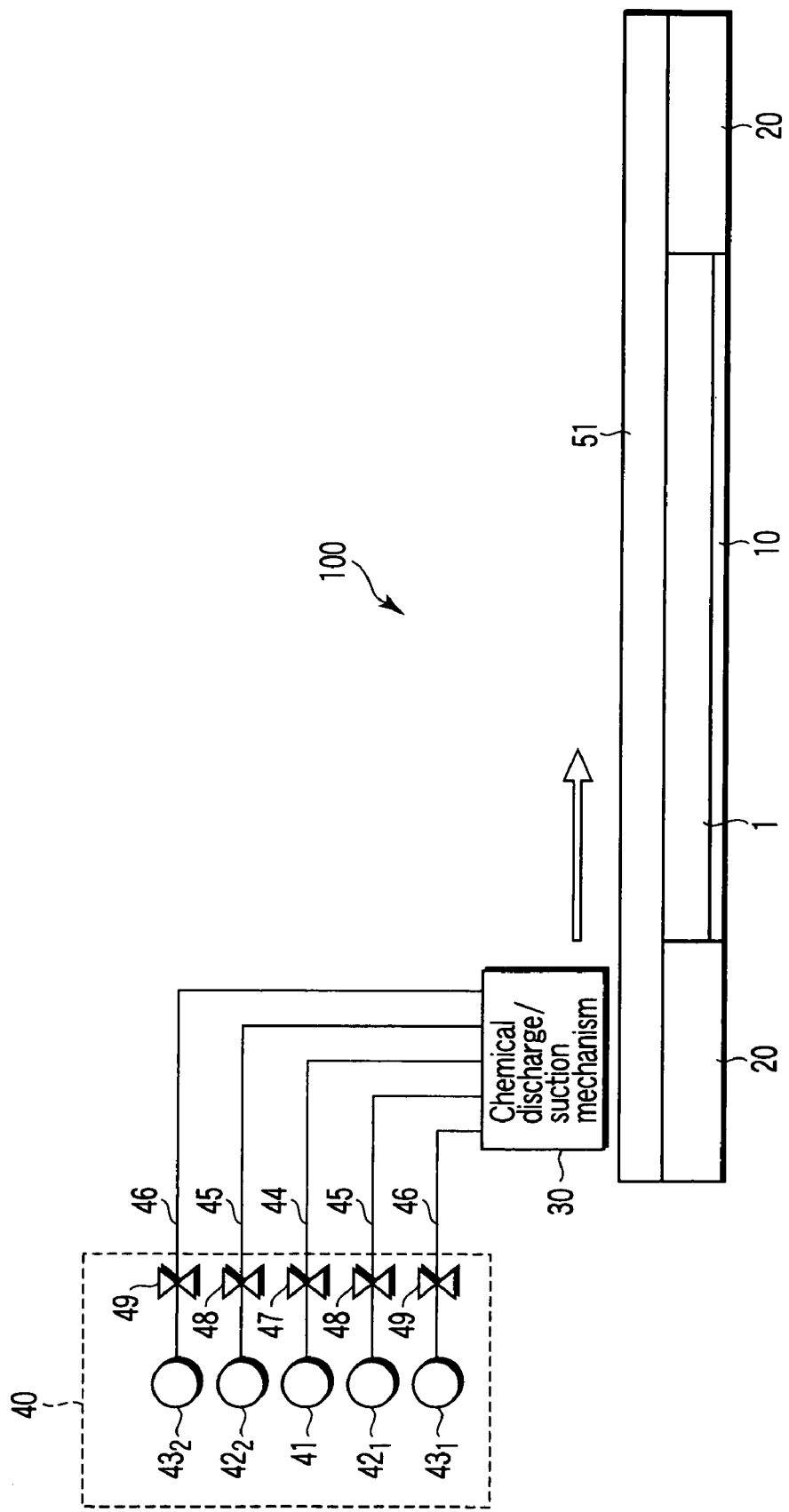
FIG. 1 is a diagram schematically showing a configuration of a developer used in an embodiment.
Figure 2:
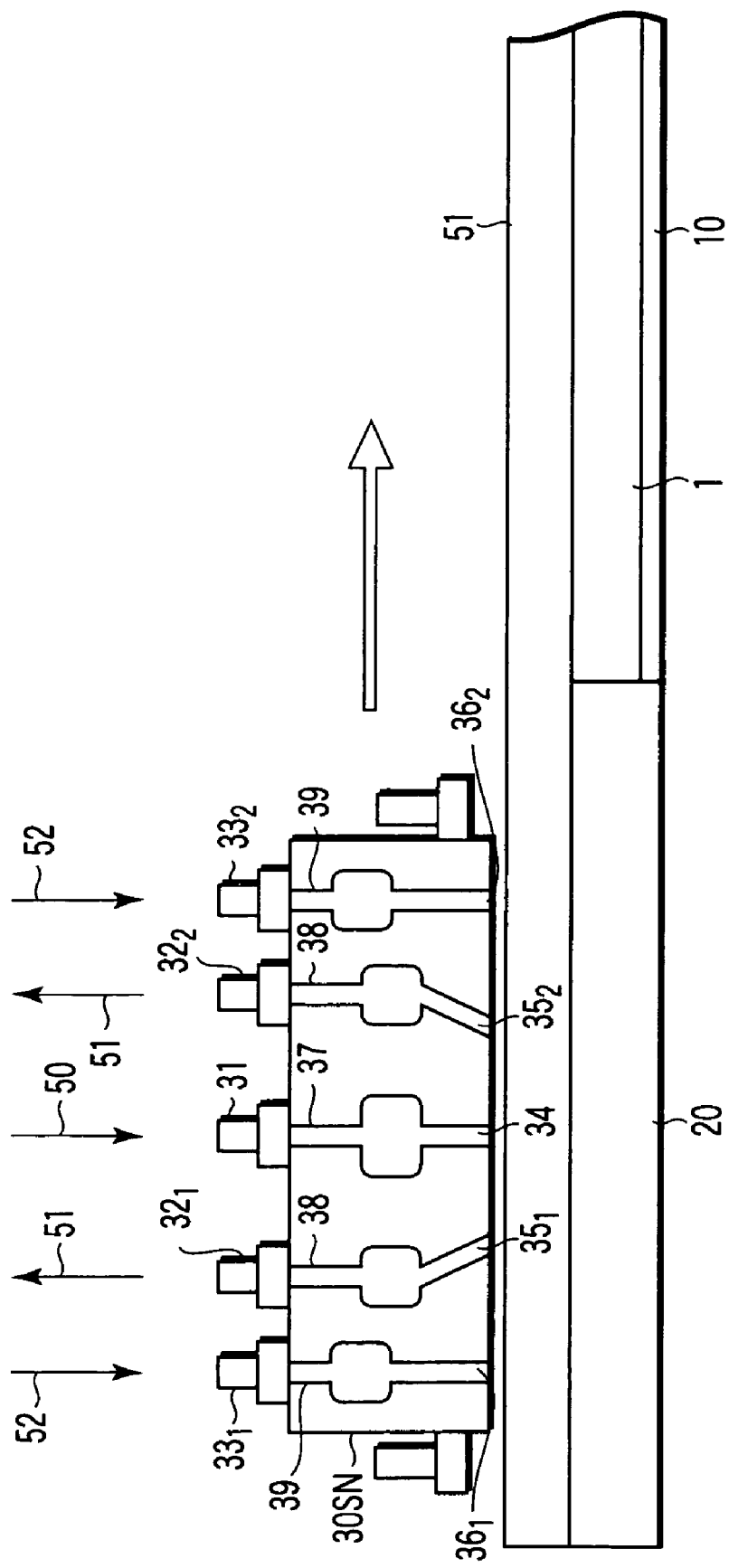
FIG. 2 is a diagram schematically showing a configuration of a chemical discharge/suction mechanism of the developer.

First of all, a developer used in the embodiment will be described herein below. FIG. 1 is a diagram schematically showing a configuration of the developer. FIG. 2 is a diagram schematically showing a configuration of a chemical discharge/suction mechanism of the developer.

A developer 100 comprises a substrate holder mechanism 10 configured to hold a substrate 1 to be processed substantially horizontally, an auxiliary plate 20 configured to surround the substrate 1 and the substrate holder mechanism 10 along peripheries thereof, and moves vertically, a chemical discharge/suction mechanism 30 disposed above the substrate holder mechanism 10, and a chemical supply/suction system 40 configured to supply a developing solution and the like into the chemical discharge/suction mechanism 30, and draw the developing solution and the like from the interior of the chemical discharge/suction mechanism 30.

The substrate 1 comprises, for example, a mask blank (substrate) and a resist film formed on the mask blank. The mask blank comprises, for example, a glass substrate and a light shield film formed on the glass substrate. The upper surface of the auxiliary plate 20 is set substantially the same height as the upper surface of the substrate 1 (upper surface of the resist film, for example).

Figure 3:
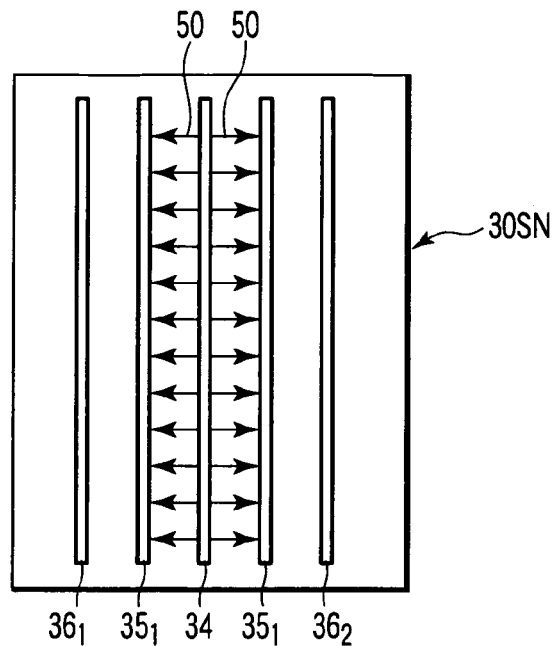
FIG. 3 is a plan view of a scan nozzle of the developer viewed from below.

As shown in FIG. 2, the chemical discharge/suction mechanism 30 comprises a chemical discharge/suction section 30SN (scan nozzle). The scan nozzle 30SN as viewed from a lower portion is shown in FIG. 3.

On an upper side of the scan nozzle 30SN, a developing solution inlet port 31 for introducing a developing solution 50, first and second solution outlet ports $32_1$ and $32_2$ for discharging a solution 51 and disposed in such a manner as to sandwich the developing solution inlet port 31, and first and second rinse inlet ports $33_1$ and $33_2$ for introducing a rinse 52 and disposed outside of the solution outlet ports $32_1$ and $32_2$ are provided. The solution 51 includes the developing solution 50, the rinse 52, and the like.

On a lower side of the scan nozzle 30SN, a slit-shaped developing solution discharge opening 34 for supplying the developing solution 50 onto the substrate 1, first and second slit-shaped chemical suction openings $35_1$ and $35_2$ for drawing the solution 51 on the substrate 1 disposed on both sides of the developing solution discharge opening 34, and first and second rinse discharge openings $36_1$ and $36_2$ for supplying the rinse 52 onto the substrate 1 disposed outside of the chemical suction openings $35_1$ and $35_2$ are provided.

The developing solution inlet port 31 is connected to the developing solution discharge opening 34 through a pipe 37. Similarly, the solution outlet ports $32_1$ and $32_2$ are connected to the chemical suction openings $35_1$ and $35_2$ through pipes 38, and the rinse inlet ports $33_1$ and $33_2$ are connected to the rinse discharge openings $36_1$ and $36_2$ through pipes 39. The pipes 37, 38, and 39 each include a solution sump.

As shown in FIG. 1, the chemical supply/suction system 40 comprises a chemical supply system 41, first and second solution suction systems $42_1$ and $42_2$, and first and second rinse supply systems $43_1$ and $43_2$. The chemical supply system 41, the liquid suction systems $42_1$ and $42_2$, and the rinse supply systems $43_1$ and $43_2$ are connected to the developing solution inlet port 31, the solution outlet ports $32_1$ and $32_2$, and the rinse inlet ports $33_1$ and $33_2$ of the chemical discharge/suction mechanism 30, respectively, through pipes 44 to 46. Valves 47 to 49 are provided midway of the pipes 44 to 46, respectively.

By pressuring a developing solution canister (not shown), the developing solution 50 is fed into the pipe 37 through the developing solution inlet port 31, and is discharged from the developing solution discharge opening 34. The solution suction systems $42_1$ and $42_2$, respectively, are connected to the solution outlet ports $32_1$ and $32_2$ through pumps (not shown). The solution 51 is drawn by suction force of the pumps. The rinse is continuously discharged from the rinse discharge openings $36_1$ and $36_2$. Solution including the developing solution and the rinse is drawn into the chemical suction openings $35_1$ and $35_2$.

A well-known gap measurement mechanism (not shown) and gap adjustment mechanism (not shown) are provided to the chemical discharge/suction mechanism 30. The developer 100 further comprises a well-known movement mechanism for moving the chemical discharge/suction mechanism 30 and the substrate holder mechanism 10 relative to one another along the substantially horizontal direction.

Figure 4:
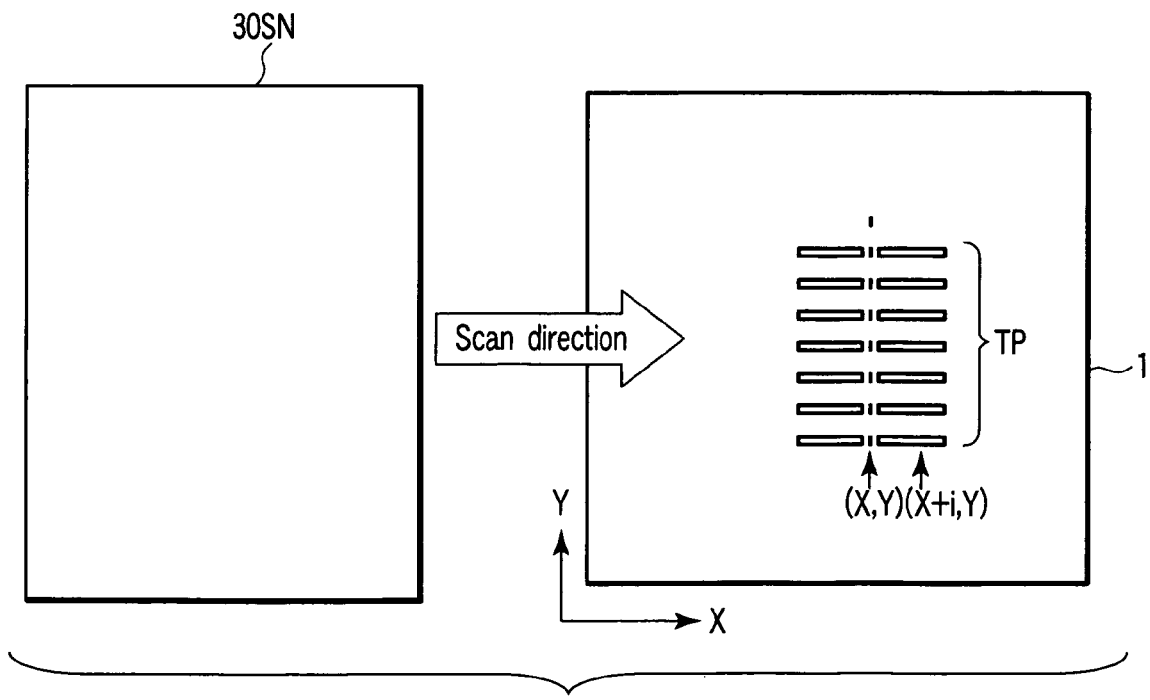
FIG. 4 is a view showing a scan direction of the scan nozzle in a development processing step.

A test pattern forming method using the developer will now be described below. As shown in FIG. 4, basically, test pattern TP is formed in the manner that discharging/suction of the developing solution 50 is carried out using the scan nozzle 30SN and scanning the scan nozzle 30SN.

Figure 5:
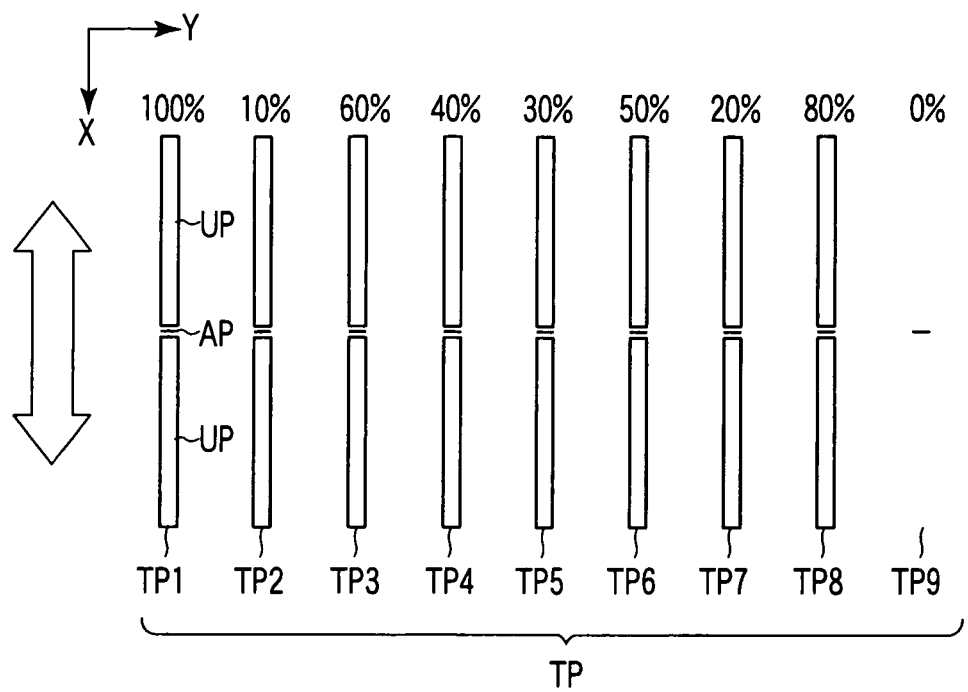
FIG. 5 is a plan view showing a test pattern.

As shown in FIG. 5, the test pattern TP comprises mainly a plurality of patterns TP1 to TP9. The arrow in the drawing indicates flows of the developing solution 50. Two flows of the developing solution 50 occur corresponding to the two chemical suction openings $35_1$ and $35_2$.

The each one of the patterns TP1 to TP9 includes an attention pattern AP, the first upper pattern UP provided above the attention pattern AP and the second upper pattern UP provided below the attention pattern AP.

Figure 6:
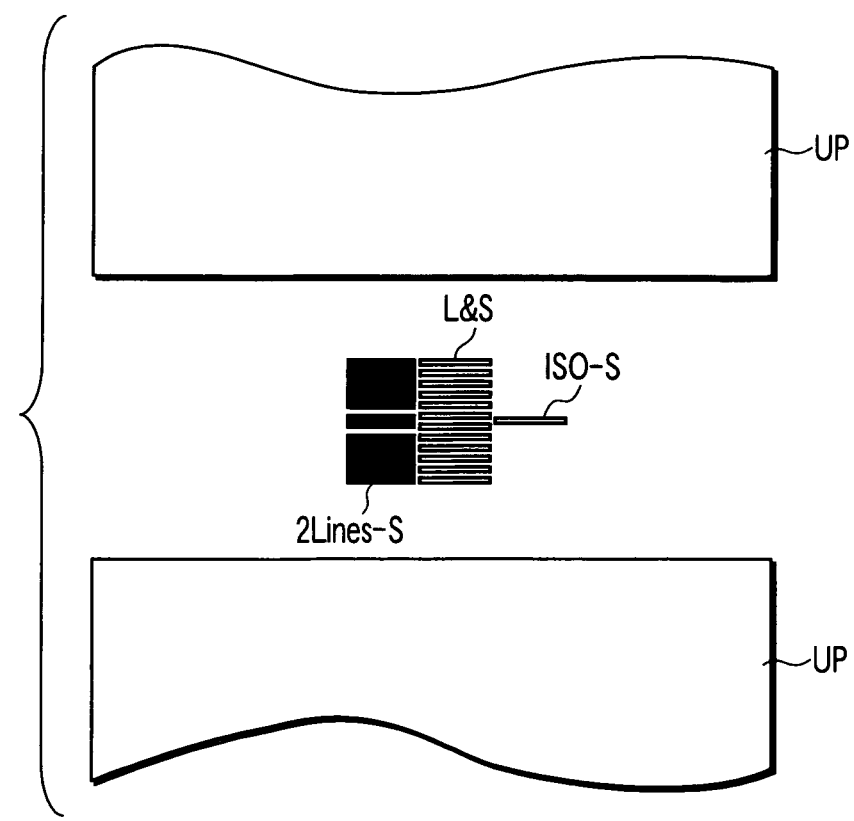
FIG. 6 is a plan view showing an attention pattern of the test pattern.

With reference to FIG. 6, the attention pattern AP comprises a 2-lines space (2Lines-S), a line & space (L&S), and an isolated space (ISO-S).

As shown in FIG. 5, the percentages (coverage) of upper patterns UP in forming regions of the respective upper patterns UP are 100%, 10%, 60%, 40%, 30%, 50%, 20%, 80%, and 0%.

In the case of the 100% coverage, the entire surface of the glass substrate corresponding to the forming region of the upper pattern UP is covered by the light shield film. In addition, at the time of etching for forming the upper pattern UP, the entire the light shield film on the glass substrate corresponding to the forming region of the upper pattern UP is covered by the resist film.

In the case of the 0% coverage, the entire surface of the glass substrate corresponding to the forming region of the upper pattern UP is exposed. In addition, at the time of etching for forming the upper pattern UP, the surface of the glass substrate corresponding to the forming region of the upper pattern UP is not covered by the resist film.

A forming process for the test pattern TP will be described below in detail.

At first, the substrate 1 is prepared. The substrate 1 comprises a glass substrate, a light shield film provided on the glass substrate, and a resist film provided on the light shield film and on which a latent image pattern corresponding to the test pattern TP is formed.

Next, the substrate 1 is horizontally held by the substrate holder mechanism 10.

Next, the solution 51 (pure water in this stage) is fed onto the substrate 1 and the auxiliary plate 20 disposed in such a manner as to surround the substrate 1. The solution 51 is supplied by a solution supply nozzle (not shown). At the time of supplying the solution 51, the solution supply nozzle is moved to a position above the substrate 1 from a solution supply nozzle standby position (not shown), after the supplying of the solution 51 is finished, the solution supply nozzle is moved to the solution supply nozzle standby position from the position above the substrate 1.

Next, the scan nozzle 30SN is moved to a position above the auxiliary plate 20 from the solution supply nozzle standby position.

Next, the scan nozzle 30SN moved to the position above the auxiliary plate 20 is moved down, and the scan nozzle 30SN is held with a lower face (nozzle lower face) thereof being in contact with the surface of the solution 51.

Next, the scan nozzle 30SN is further moved down until a gap between the nozzle bottom surface and the auxiliary plate 20 reaches a desired value, thereafter, with the gap being maintained at the desired value, the operations of developing solution discharging, solution suction, and rinse discharging are performed, and scanning above the substrate 1 by the scan nozzle 30SN at a predetermined speed, thereby, the development process is performed. At this time, the scan nozzle 30SN scans in a state that the developing solution discharge opening 34, the chemical suction openings $35_1$ and $35_2$, and the rinse discharge openings $36_1$ and $36_2$ are opposed to the upper surface of the substrate 1.

The developing solution discharge flow rate, the solution suction flow rate, and suction pressure of the solution suction flow rate are preliminarily adjusted so that the developing solution discharged from the developing solution discharge opening 34 can be drawn into the chemical suction openings $35_1$ and $35_2$.

Next, the substrate 1 is rotated to throw off the solution on the substrate 1, thereafter, the substrate is dried (post-exposure baking process), thereby, the test pattern TP is formed.

As shown in FIG. 1, When the scan nozzle 30SN comprising the arranged developing solution discharge opening 34, the chemical suction openings $35_1$ and $35_2$ and the rinse discharge openings $36_1$ and $36_2$ is used, the flow rate of the developing solution becomes same and the direction of the developing solution becomes uniform at respective points (x, y) on the substrate 1.

As for the loading effect (development loading effect), the following is confirmed by experiment of the inventors. The development byproduct (dissolution product) generated by the development reaction, concentration-varied developing solution, or the like flows from its generation site, whereby the pattern dimension on the downstream side causes CD to vary by an amount (concentration) of the generation of the development byproduct.

Accordingly, for each site on the substrate to be processed, a pattern opening ratio of a pattern in a region which exists an upstream direction of flow of the developing solution in a development step is calculated, the relationship between pattern opening ratio and amount of pattern dimension variation is obtained beforehand by using a test pattern, an exposure dose (correction exposure dose) for correcting the amount of pattern dimension variation depending on the pattern opening ratio is determined using the obtained relationship so that the actual pattern dimension is to be a design pattern dimension for each site on the substrate to be processed, and exposure process is carried out using the exposure dose (correction exposure dose), thereby, the pattern dimension variation caused by the development loading can be corrected with high accuracy.

In the case where the developer shown in FIG. 4 is used, as described above, the developing solution flow rate and the developing solution flow direction are even, so the movements of substances, such as a dissolution product generated during the development and concentration-varied developing solution, which possibly induce the development loading effect, can be uniformed on the in-plane. Thereby, with the correction method being used, dimensional errors (CD variations) due to the development loading effect occurring for various patterns can be easily and accurately predicted, and, the dimensional errors can easily be corrected simply by pre-determining conditions to correct the development loading effect by the exposure apparatus.

The pattern forming method according to the present embodiment takes the above-described situations into account. The pattern forming method according to the present embodiment will be further described below.

FIG. 7 is a diagram showing the relationship (pattern opening ratio dependability of development-caused CD variation) between the opening ratios of the upper patterns UP (pattern opening ratios) and the amounts of pattern dimension variation (measured pattern dimension-design pattern dimension) of the attention pattern AP.

Shown in FIG. 7 is obtained by actually measuring dimension of test pattern TP (here, pattern comprising a light shield film) which is actually formed through the development step.

The pattern opening ratio is the ratio (percentage) of an area of a surface of a glass substrate exposed in an area of a forming region of the upstream side pattern UP (which hereafter will be simply referred to as "pattern formed region") to the area of the pattern forming region. In other words, the pattern opening ratio is the ratio of an area of the glass substrate exposed in the pattern forming region before development viewed from the top to an area of the resist film in the pattern forming region after exposure viewed from the top.

In addition, instead of measuring the dimension of the actual pattern formed through the development and etching steps, the dimension of actual resist pattern formed through the development step is measured, thereby, the relationship between the pattern opening ratio and the amount of pattern dimension variation may be obtained.

It is confirmed that the nine measurement values (amounts of pattern dimension variation for the respective pattern opening ratios of 100%, 90%, 80%, 70%, 60%, 50%, 40%, 30%, 20%, 10%, and 0%) can be linearly approximated as shown in FIG. 7.

When $\Delta W$ represents the amount of pattern dimension variation shown in FIG. 7 and V represents the pattern opening ratio shown therein, equation (1) is satisfied:

$$\Delta W = \alpha \cdot V \quad (1)$$

In the equation, $\alpha$ is a coefficient (slope of the line in FIG. 7).

FIG. 8 is a diagram showing the relationship (exposure dose dependability of pattern dimension) between exposure dose and pattern dimension obtained by actually forming each of attention patterns AP (2-lines space, line & space, and isolated space) for a plurality of exposure doses, and actually measuring each of the dimension of attention pattern AP (pattern dimension) for the plurality of exposure doses.

As the pattern dimensions on the vertical axis in FIG. 8, an average value of measured values obtained for each of the pattern opening ratio is employed. More specifically, employed is an average value of, for example, the line & space pattern dimensions (nine pattern dimensions) for the pattern opening ratios of 0%, 10%, 20%, 40%, 50%, 60%, 80%, 90%, and 100%. The exposure dose on the horizontal axis in FIG. 8 is on log scale.

In addition, instead of measuring the dimension of the actual pattern formed through the development and etching steps, the dimension of actual resist pattern formed through the development step is measured, thereby, the relationship between the exposure dose and the pattern dimension may be obtained.

As shown in FIG. 8, it is confirmed that the relationship between the pattern dimension and the exposure dose can be linearly represented.

When W represents the pattern dimension in FIG. 8, and D represents the exposure dose (amount of design irradiation dose) at the time of forming the attention pattern AP, shown therein, equation (2) below is satisfied:

$$W = a \cdot \mathrm{Log}(D) + b \quad (2)$$

In this case, a and b, respectively, are coefficients.

As equation (2) is differentiated, equation (3) below is obtained:

$$\Delta D = \Delta D \cdot \Delta W / a \quad (3.)$$

As $\Delta W = \alpha \cdot V$ of equation (1) is substituted for $\Delta W$ of equation (3), equation (4) below can be obtained:

$$\Delta D = (\alpha/a) D \cdot V \quad (4.)$$

In equation (4), $\alpha/a (=C)$ is a constant. Constant C is approximately the same value, regardless of the type of the attention pattern AP (isolated space, line & space, or 2-lines space).

Accordingly, with reference to FIG. 7, when correcting an amount of pattern dimension variation $\Delta W$ at a certain pattern opening ratio V, it is sufficient to vary the exposure dose (amount of irradiation dose) by $\Delta D$ (correction exposure dose) obtained from equation (4).

The relationships shown in FIGS. 7 and 8 are formed beforehand. Generally, such relationships as shown in FIGS. 7 and 8 do not have to be formed for each execution of the process. In addition, although the relationships shown in FIGS. 7 and 8 are each linearly represented, a case occurs in which the relationship cannot be liner depending upon the type (shape) of the attention pattern. In this case, as well, the correction exposure dose ΔD can be obtained in a similar manner.

Figure 9:
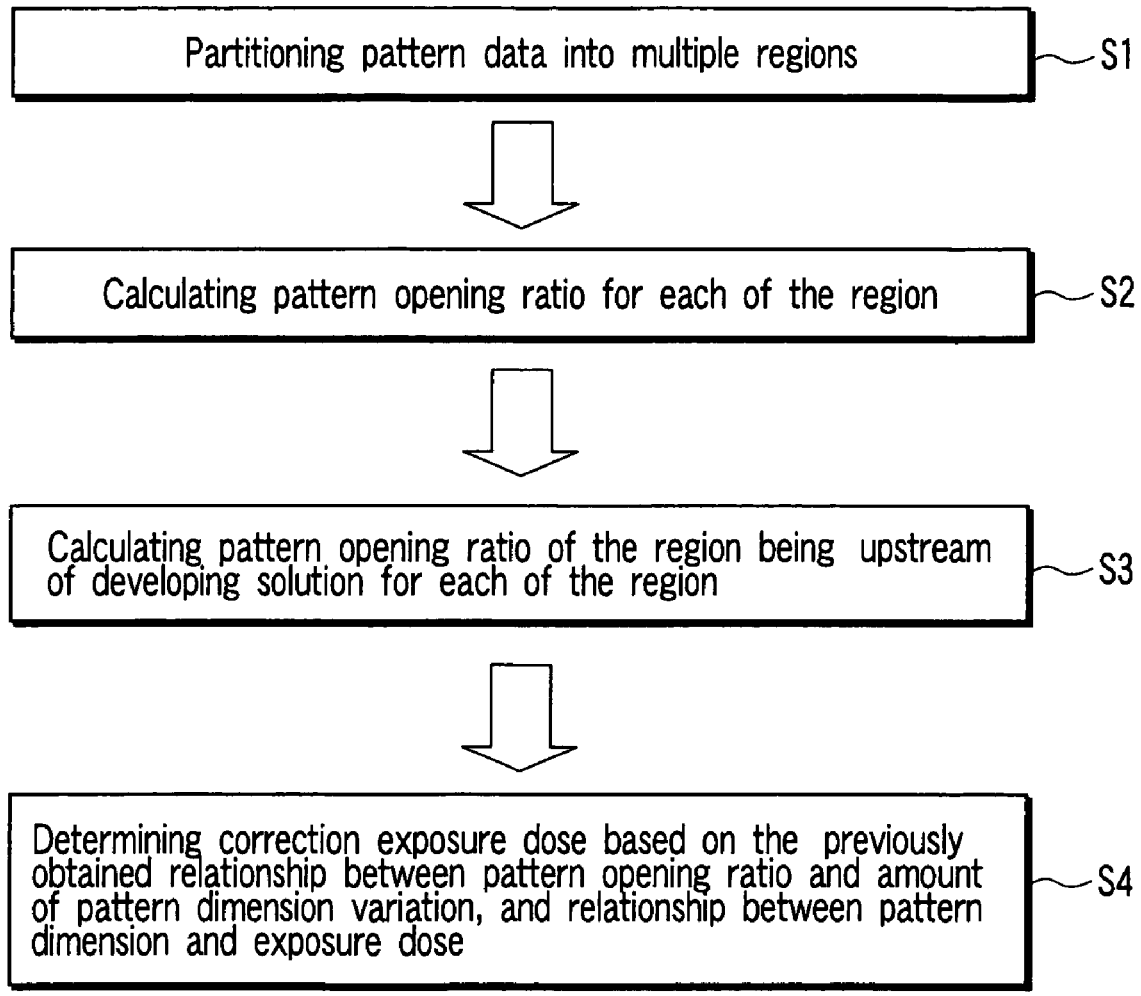
FIG. 9 is a flowchart for explaining a pattern forming method of an embodiment.

The pattern forming method of the present embodiment will be further described with reference to a flowchart shown in FIG. 9.

Figure 10:
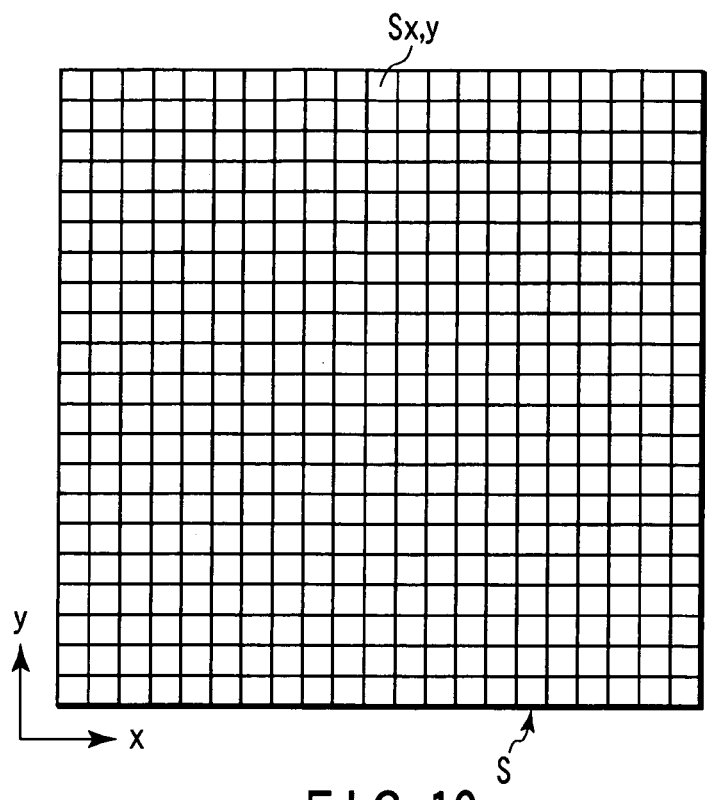
FIG. 10 is a view showing appearance of a main surface of a substrate to be processed partitioned into a plurality of regions.

At first, a surface (main surface) of a substrate to be processed on which a pattern is to be formed is partitioned into a plurality of regions (step S1). More specifically, as shown in FIG. 10, the main surface S of the substrate is partitioned into a plurality of regions Sx, y, each of which is a square having the side of 0.1 mm. The size of region Sx, y can be reduced to a size of region which can be exposed by single shot.

Next, for each of the region Sx, y, the opening ratio of pattern formed on the region Sx, y is calculated (step S2). The opening ratio is calculated by referring the design pattern data, or the like. Here, the pattern is formed of a light shield film on the glass substrate.

Next, for each of the region Sx, y, pattern opening ratio of pattern being formed on a region which is further upstream of the developing solution than the region Sx, y is calculated (step S3). For instance, for a region S9, 12, pattern opening ratios of nine regions S9, 13 to 9, 21 are calculated. The respective opening ratio is calculated by referring the design pattern data, or the like.

Next, for each of the region Sx, y, the correction exposure dose is determined based on the previously obtained relationship (pattern opening ratio dependability of CD variation caused by development) between the pattern opening ratio and the amount of pattern dimension variation, and the relationship (exposure dose dependability of pattern dimension) between the pattern dimension and the exposure dose (step S4).

Figure 11:
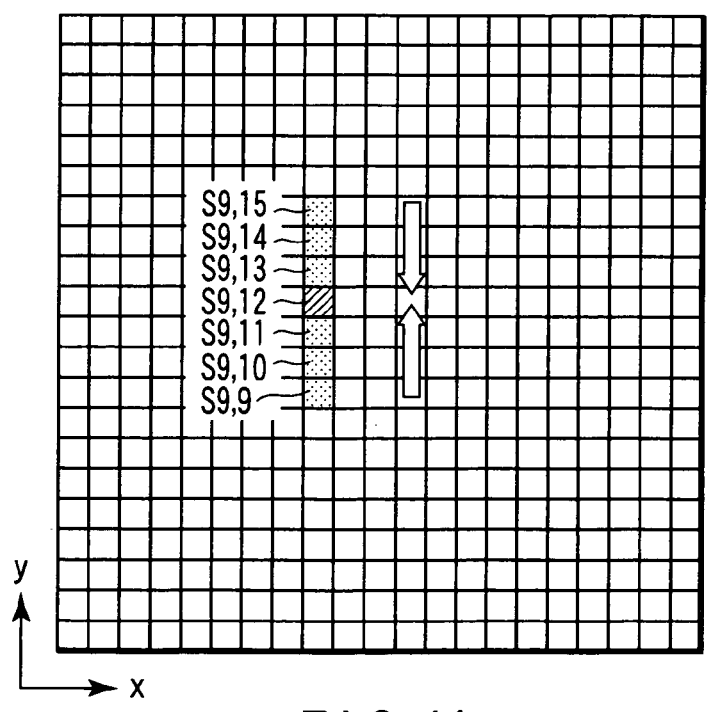
FIG. 11 is a view showing regions in a range influencing a region S9, S12.

At this time, for each of the region Sx, y, regions within a range influencing the region Sx, y are specified. For instance, as shown in FIG. 11, for the region S9, 12, regions permitting the descending developing solution flow correspond to regions S9, 13, S9, 14, and S9, 15, and regions permitting the ascending developing solution flow correspond to regions S9, 11, S9, 10, and S9, 9. In FIG. 11, the arrows indicate the developing solution flow directions.

In this case, for the regions permitting the descending developing solution flow, the pattern opening ratio takes an average value of the opening ratios of regions S9, 13, S9, 14, and S9, 15. On the other hand, for the regions permitting the ascending developing solution flow, the pattern opening ratio takes an average value of the opening ratios of regions S9, 11, S9, 10, and S9, 9.

Next, an irradiation dose amount for each of the region Sx, y is calculated based on the correction exposure dose (exposure dose for correcting development loading effect), a correction exposure dose for correcting proximity effect, a correction exposure dose for correcting electron beam fogging effect, and an initial exposure dose (exposure dose calculated on the assumption that the design pattern dimension can be obtained without performing the above-described various corrections), and each of the region Sx, y is exposed using the calculated irradiation dose amount.

The step of determining the correction exposure dose for each of the plurality of regions (relating to the development loading effect) can be modified in various ways in a range included in a technical scope described below.

That is, a feature is that in the step of determining correction exposure dose in M regions (M ≧2), the correction exposure dose of an i-th region (1≦i≦M). is determined using the following two relationships which are previously obtained. One of the two relationships is a relationship between pattern opening ratio and pattern dimension variation amount. In this relationship, the pattern opening ratio is either a pattern opening ratio of a resist pattern formed on a substrate or a pattern opening ratio of a pattern formed by etching of the substrate by using the resist pattern as a mask, and the pattern dimension variation amount is dimensional difference between actually measured dimension of the pattern and the design pattern dimensions. The other relationship is a relationship between the actually measured dimension of the pattern and exposure dose at the time of forming the resist pattern.

Thereafter, conventional mask process continues. More specifically, a step of forming resist pattern by performing the development process and the baking (post-exposure baking) process, a step of forming pattern (mask pattern) comprising a light shield film on a glass substrate by etching the light shield film using the resist patterns as a mask, and a step of removing the resist pattern are carried out, thereby the a photomask is completed.

The three sigma value (3σ) of the photomask formed according to the method of the present embodiment is found to be 4.8 nm, whereas the three sigma value of a photomask thus formed according to the conventional method (method not using the correction exposure dose for correcting the development loading effect) is found to be 5.3 nm. From these values, it can be known that the pattern forming method according to the present embodiment offers high effect of improving the in-plane uniformity.

A semiconductor device manufacturing method according to the present embodiment includes a step of forming latent image of mask pattern by using the photomask manufactured by the manufacturing method of the present embodiment on a resist film applied on a substrate (substrate to be processed) including a semiconductor substrate, a step of developing the resist film on which the latent image is formed, thereby to form a resist pattern, a step of etching the substrate using the resist pattern as a mask, and a step of removing the resist pattern.

The substrate including the semiconductor substrate refers to a semiconductor substrate per se, such as a silicon substrate, or a substrate including the semiconductor substrate and an insulation film or conductive film formed on the semiconductor substrate. In the case of etching. the semiconductor substrate per se, the above-described step of etching the substrate is, for example, a step of etching for forming an isolation trench. In the case of etching the semiconductor substrate including the insulation film and the like, the above-described step of etching the substrate is, for example, an etching step for forming, for example, a contact hole or wiring trench.

The above-described semiconductor device refers to a device, such as a semiconductor memory and a liquid crystal display device, using a semiconductor element.

In step S4 described above, in order to determine the correction exposure dose even more accurately, an exposure dose corresponding to a ration of CD variation caused due to the distance from the attention pattern may preferably be added to the ΔD. For example, taking into account the fact that a pattern exists in a region closer to the attention pattern has a greater effect, it is preferable that an exposure dose obtained by being weighted with a Gaussian function or a similar function be added to the ΔD.

In addition, in the present embodiment, two directions opposite to one another are employed as the developing solution flow directions. In this case, the solution flow direction in the first half of the development process and the solution flow direction in the second half of the development process can be changed. Consequently, development byproducts can be dispersed along two different directions. Thereby, the original amount of dimension variation due to the development byproducts can be reduced. Accordingly, also the correction exposure dose can be reduced, therefore making it possible to widen the margin with respect to the correction accuracy.

Figure 14:
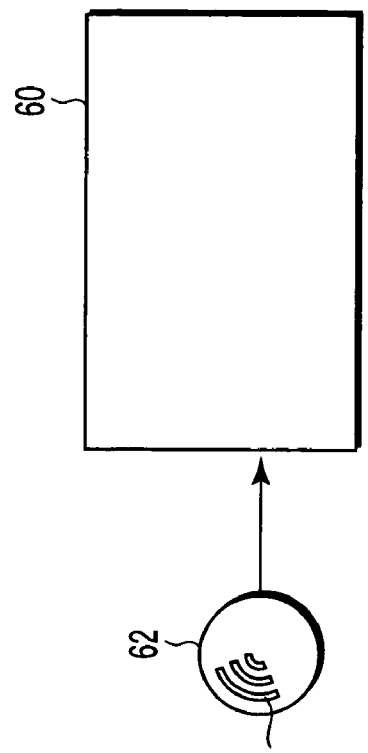
FIG. 14 is a view for explaining a computer program product of an embodiment.

With reference to FIG. 14, the method of the embodiment described above can also be carried out in the form of a computer program product 62 (for instance, CD-ROM, DVD) that contains a program 61 for executing a system including a computer 60. That is, the computer program product 62 according to the embodiment is to cause the computer 60 to execute instructions corresponding to steps S1 to S4 shown in FIG. 9.

The program 61 is executed using hardware resources, such as a CPU and memory in the computer 60 (external memory may be concurrently used for the memory, depending on the case). The CPU reads necessary data from the memory, and executes instructions corresponding to the steps described above for the read data. The result of the respective step (execution of the respective instruction) is temporarily stored by necessary in the memory, and is read out when it is required in the other step (instruction).

According to the embodiment described above, the pattern dimension error (CD error) can be reduced, and hence CD uniformity can be improved.

Second Embodiment

The present embodiment is different from the first embodiment in that the present embodiment corrects not only the loading effect occurring at the time of development, but also loading effect occurring at the time of baking (PEB: Post Exposure Baking) after the exposure step.

The loading effect (pattern density dependability caused by bake) occurring at the time of baking means the following phenomenon. Acid generated in an exposed area and other substance which changes the resist sensitivity, which are included in a resist film, or substance included in a quencher, which changes the resist sensitivity are diffused (evaporated and redeposited) by gas flow on the resist film during baking to a peripheral region of the exposed region. Thereby, the sensitivity of the peripheral region of the resist film is changed,. consequently variation of pattern dimension after the development is caused.

It is difficult to separately to think of the baking-caused pattern density dependability (bake loading effect) and development-caused pattern density dependability in one processing. However, a method of the present embodiment described below enables it to correct the respective pattern density dependabilities (pattern opening ratio dependabilities).

At first, as described in the first embodiment, the correction exposure dose for correcting the loading effect occurring at the time of development is obtained.

Next, as shown in FIG. 12, the flow direction of gas (gas flow direction) over the substrate 1 at the time of baking and the flow direction of the developing solution (nozzle scan direction) over the substrate 1 at the time of development are directed different from one another. In the case of FIG. 12, the substrate 1 is taken into a baking apparatus (not shown) so that the gas flow direction is 90 degrees different with respect to the developing solution flow direction.

The baking apparatus comprises a process chamber in which a substrate to be processed is taken into, and a heating device configured to heat the substrate in the processor. The process chamber comprises a gas inlet port for introducing an inert gas, and a gas outlet port for discharging gas in the process chamber to the outside.

The gas inlet port and the gas outlet port are provided in positions opposite to one another. In this case, the gas flow direction is from the gas inlet port to the gas outlet port.

The gas inlet port and the gas outlet port each have, for example, a slit-shaped opening. The dimensions of the openings, respectively, are longer than the diameter of the substrate. That is, the dimensions of the gas inlet port and the gas outlet port are selected so that gas flows over the substrate become equal in one direction within the overall in-plane of the substrate.

Figure 13:
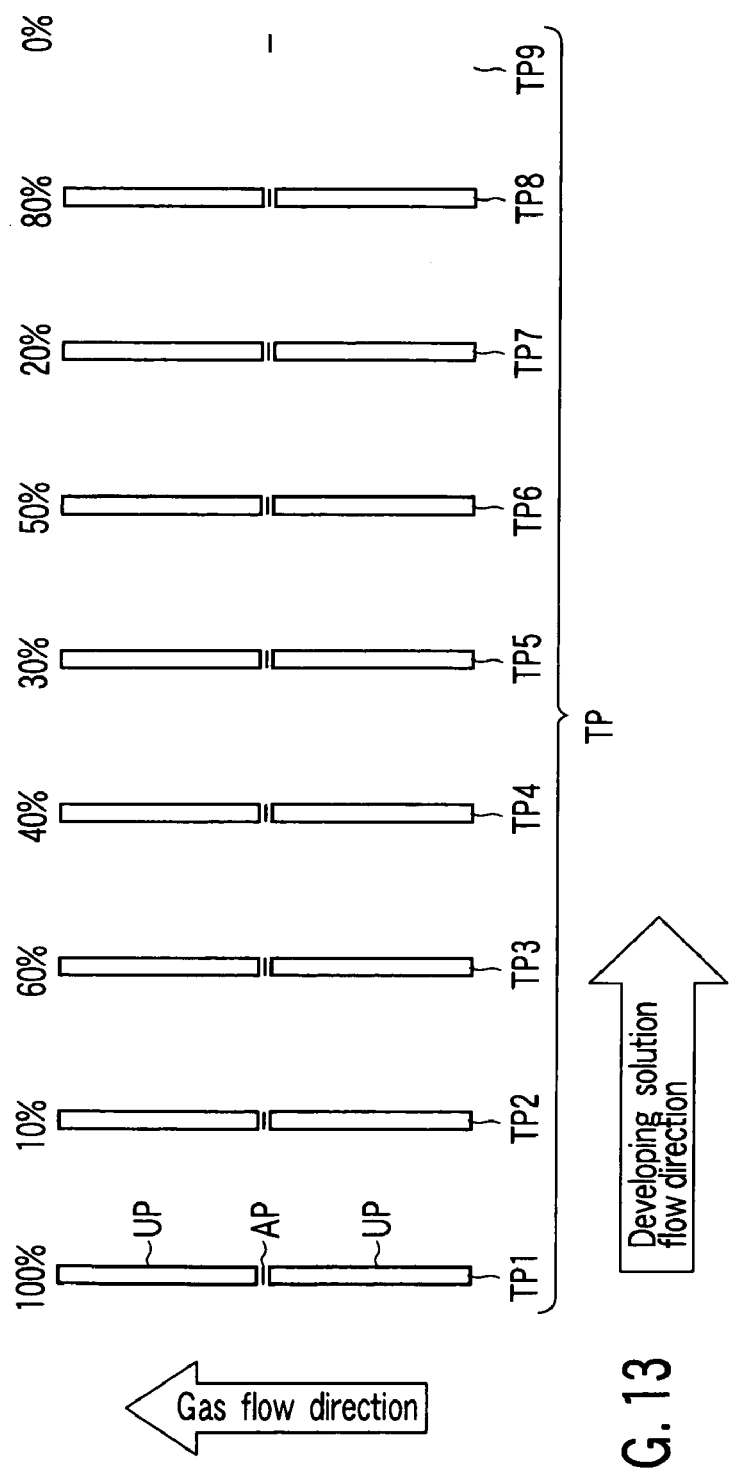
FIG. 13 is a view showing the relationship between a longitudinal direction of a test pattern and the airflow direction at the time of baking process step.

In a case where the gas flow direction is 90-degree different with respect to the developing solution flow direction, the longitudinal directions of forming regions of the patterns TP1 to TP9 are parallel to the gas flow direction (see FIG. 13). Therefore, a gas flow generated on a certain test pattern TPi almost does not flow to a test pattern TPi+1 adjacent thereto. Thereby, for a certain point (x, y) on the substrate 1, it is possible to extract only the amount of pattern dimension variation due to bake loading effect received from a certain point (x+i, y) which exists upstream of the gas flow.

Next, relationship equivalent to that shown in FIG. 7 in the first embodiment is obtained. That is, the relationship (pattern opening ratio dependability of baking-caused CD variation) between the amount of pattern dimension variation and the pattern opening ratios is obtained based on the pattern dimension (actually measured pattern dimension) of attention patterns AP of patterns TP1 to TP9, which is obtained by actually measuring the dimension of a test pattern TP (here, pattern formed of a light shield film) actually formed through the development step and the baking step, and design pattern dimension of the attention pattern AP in the patterns TP1 to TP9.

Instead of measuring the dimension of the actual pattern, the dimension of actual resist pattern may be measured, thereby to obtain the relationship between the pattern opening ratio and the amount of pattern dimension variation. Similarly, the relationship between the exposure dose and the pattern dimension, which is corresponding to FIG. 8 in the first embodiment, is obtained.

The two relationships are formed beforehand. Generally, similarly as the relationships shown in FIGS. 7 and 8, the relationships do not have to be formed for each execution of the process. The pattern forming method of the present embodiment will be further described below.

At first, a surface (main surface) of a substrate to be processed on which a pattern is to be formed is partitioned into a plurality of regions (step corresponding to step S1 in the first embodiment). More specifically, the main surface of the substrate is partitioned into a plurality of regions, each of which is a square having the side of 0.1 mm. The size of region can be reduced to a size of region which can be exposed by single shot.

The number of partitions of the main surface for obtaining the correction exposure to suppress the developing loading effect may be identical to or different from the number of partitions of the main surface for obtaining the correction exposure to suppress the bake loading effect.

Next, for each of the region, the opening ratio of pattern formed on the region is calculated (step corresponding to step S2 in the first embodiment). Here, the pattern is formed of a light shield film.

Next, for each of the region, pattern opening ratio of pattern being formed on a region which is further upstream of the gas flow than the region is calculated (step corresponding to step S3 in the first embodiment).

Next, for each of the region, the correction exposure dose is determined based on the previously obtained relationship (pattern opening ratio dependability of CD variation caused by bake) between the pattern opening ratio and the amount of pattern dimension variation, and the relationship (exposure dose dependability of pattern dimension) between the pattern dimension and the exposure dose (step corresponding to step S4 in the first embodiment).

At this time, similarly as in the first embodiment, for each of the region, regions within a range influencing the region are specified. Further, in order to determine the correction exposure dose even more accurately, an exposure dose corresponding to a fraction of CD variation caused due to the distance from the attention pattern may be added to ΔD.

Next, an irradiation dose amount for each of the region is calculated based on the correction exposure dose (exposure dose for correcting development loading effect, exposure dose for correcting bake loading effect), a correction exposure dose for correcting proximity effect, a correction exposure dose for correcting electron beam fogging effect, and an initial exposure dose (exposure dose calculated on the assumption that the design pattern dimension can be obtained without performing the above-described various corrections), and each of the region is exposed using the calculated irradiation dose amount.

The step of determining the correction exposure dose for each of the plurality of regions (relating to the bake loading effect) can be modified in various ways in a range included in a technical scope described below.

That is, a feature is that in the step of determining correction exposure dose in N regions (N $\geq$ 2), the correction exposure dose of a j-th region (1 $\leq$ j $\leq$ N) is determined using the following two relationships which are previously obtained. One of the two relationships is a relationship between pattern opening ratio and pattern dimension variation amount. In this relationship, the pattern opening ratio is either a pattern opening ratio of a resist pattern formed on a substrate or a pattern opening ratio of a pattern formed by etching of the substrate by using the resist pattern as a mask, and the pattern dimension variation amount is dimensional difference between actually measured dimension of the pattern and the design pattern dimensions. The other relationship is a relationship between the actually measured dimension of the pattern and exposure dose at the time of forming the resist pattern.

Thereafter, conventional mask process continues. More specifically, a step of forming resist pattern by performing the development process and the baking (post-exposure baking) process, a step of forming pattern (mask pattern) comprising a light shield film on a glass substrate by etching the light shield film using the resist patterns as a mask, and a step of removing the resist pattern are carried out, thereby the a photomask is completed.

The three sigma value (3σ) of the photomask formed according to the method of the present embodiment is found to be 4.4 nm, whereas the three sigma value of a photomask thus formed according to the conventional method (method not using the correction exposure dose for correcting the development and bake loading effects) is found to be 4.8 nm. From these values, it can be known that the pattern forming method according to the present embodiment offers high effect of improving the in-plane uniformity.

A semiconductor device manufacturing method according to the present embodiment includes a step of forming latent image of mask pattern by using the photomask manufactured by the manufacturing method of the present embodiment on a resist film applied on a substrate (substrate to be processed) including a semiconductor substrate, a step of developing the resist film on which the latent image is formed, thereby to form a resist pattern, a step of etching the substrate using the resist pattern as a mask, and a step of removing the resist pattern.

The definition of the substrate including the semiconductor substrate or the like is the same as in the first embodiment.

Further, the method of the embodiment described above can also be carried out in the form of a computer program product that contains a program for executing a system including a computer (ref. FIG. 14.) That is, the computer program product relating to the pattern forming method of the embodiment is to cause the computer to execute instructions corresponding to the above mentioned steps corresponding to the steps S1 to S4 in the first embodiment.

The program is executed using hardware resources, such as a CPU and memory in the computer (external memory may be concurrently used for the memory, depending on the case). The CPU reads necessary data from the memory, and executes instructions corresponding to the steps described above for the read data. The result of the respective step (execution of the respective instruction) is temporarily stored by necessary in the memory, and is read out when it is required in the other step (instruction).

According to the embodiment described above, the CD error caused by the bake loading effect and the CD error caused by the development loading effect can be differentiated and corrected, and hence CD uniformity can be further improved.

In the first and second embodiments, the substrate to be processed is, respectively, partitioned into the square regions each having the side of 0.1 mm and 0.5 mm. However, in order to achieve even higher accuracy, the dimension of partition (correction grid) may even be set to a submicron order of about 0.1 μm.

In addition, the first and second embodiments have been described with reference to the case of the electron beam exposure. However, the present invention may also be adapted to the exposure using a charged beam other than the electron beam (for example, ion beam), or light exposure.

In addition, the flow directions, such as the gas flow direction at the time of baking and the developing solution flow direction at the time of development, are not limited to those in the embodiments, but may be appropriately altered.

In addition, the first and second embodiments have been described with reference to the case of the photomask including two regions (glass substrate, light shield film) different in transmittance from one another. However, the present invention may also be adapted to a photomask including three regions (glass substrate, light shield film, semitransparent film) different in transmittance from one another.

The first and second embodiments use the developer (or, developing process method) permitting the developing solution to flow in two directions. However, a developer (or, developing process method) permitting the developing solution to flow in a single direction may instead be used. This can be realized, for example, by omitting the chemical suction opening $35_1$, the solution outlet port $32_1$, and the pipe 38 connecting them, which are shown in FIG. 2.

Further, the first and second embodiments uses the developer (or, developing process method) permitting the scan direction of the scan nozzle 30SN to be parallel with the developing solution flow direction. However, a developer (or, development processing method) permitting the two directions to be perpendicular to one another may instead be used. This can be realized, for example, by setting the chemical suction opening $35_1$, $35_2$, which is shown in FIG. 3, in a 90-degree rotated position. That is, the disposing position of the respective chemical suction opening $35_1$, $35_2$ is determined to be perpendicular so that the longitudinal direction of the chemical suction opening $35_1$, $35_2$ are perpendicular to the scan direction of the scan nozzle 30SN.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
forming a resist film on a main surface of a substrate;
exposing the resist film to form a latent image of a pattern on the resist film;
developing the resist film by flowing a developing solution on the resist film to form a resist pattern, the developing the resist film comprising partitioning the main surface of the substrate into M ($\geq 2$) regions and determining a correction exposure dose for each of the M regions, the determining the correction exposure dose including determining a correction exposure dose for an i-th ($1 \leq i \leq M$) region so that an actual pattern dimension of a pattern on the i-th region matches a design pattern dimension based on a pattern opening ratio of a pattern located on an upstream region which is further upstream than the i-th region along a flow direction of the developing solution; and
forming a pattern on the substrate by etching the substrate using the resist pattern as a mask.

2. The pattern forming method according to claim 1, further comprising baking the exposed resist film before the developing the resist film; and
the exposing the resist film further comprising:
partitioning the main surface of the substrate into N ($\geq 2$) regions; and
determining a correction exposure dose for each of the N regions, the determining of a correction exposure dose including determining a correction exposure dose for a j-th ($1 \leq j \leq N$) region relating to a pattern opening ratio of a pattern for a region located further upstream than the j-th region along an upstream direction of an atmospheric flow on the resist film during the baking of the resist film so that an actual pattern dimension of a pattern for the j-th region matches a design pattern dimension.

3. The pattern forming method according to claim 1, wherein the determining of the correction exposure dose for the i-th ($1 \leq i \leq M$) region is performed by taking into account an exposure dose dependability of the dimension of the pattern to be formed on the substrate.

4. The pattern forming method according to claim 2, wherein the determining the correction exposure dose for the i-th ($1 \leq i \leq M$) region is performed by taking into account an exposure dose dependability of the dimension of the pattern to be formed on the substrate.

5. The pattern forming method according to claim 1, wherein the exposing the resist film includes irradiating an electron beam, light, or ions on the resist film.

6. The pattern forming method according to claim 2, wherein the exposing the resist film includes irradiating an electron beam, light, or ions on the resist film.

7. The pattern forming method according to claim 3, wherein the exposing the resist film includes irradiating an electron beam, light, or ions on the resist film.

8. A photomask manufacturing method comprising:
preparing a substrate including a light shield film on which a resist film is formed, the light shield film being formed on a main surface of the substrate;
exposing the resist film to form a latent image of a pattern on the resist film;
developing the resist film by flowing a developing solution on the resist film to form a resist pattern, the developing the resist film comprising partitioning the main surface of the substrate into M ($\geq 2$) regions and determining a correction exposure dose for each of the M regions, the determining the correction exposure dose including determining a correction exposure dose for an i-th ($1 \leq i \leq M$) region so that an actual pattern dimension of a pattern on the i-th region matches a design pattern dimension based on a pattern opening ratio of a pattern located on an upstream region which is further upstream than the i-th region along a flow direction of the developing solution; and light shield film using the resist pattern as a mask.

9. The photomask manufacturing method according to claim 8, further comprising baking the exposed resist film before the developing the resist film; and
the exposing the resist film further comprising:
partitioning the main surface of the substrate into N ($\geq 2$) regions; and
determining a correction exposure dose for each of the N regions, the determining of a correction exposure dose including determining a correction exposure dose for a j-th ($1 \leq j \leq N$) region relating to a pattern opening ratio of a pattern for a region located further upstream than the j-th region along an upstream direction of an atmospheric flow on the resist film during the baking of the resist film so that an actual pattern dimension of a pattern for the j-th region matches a design pattern dimension.

10. The photomask manufacturing method according to claim 8, wherein the determining the correction exposure dose for the i-th ($1 \leq i \leq M$) region is performed by taking into account an exposure dose dependability of the dimension of the pattern to be formed on the substrate.

11. The photomask manufacturing method according to claim 9, wherein the determining the correction exposure dose for the i-th ($1 \leq i \leq M$) region is performed by taking into account an exposure dose dependability of the dimension of the pattern to be formed on the substrate.

12. The photomask manufacturing method according to claim 8, wherein exposing the resist film includes irradiating an electron beam, light, or ions on the resist film.

13. The photomask manufacturing method according to claim 9, wherein exposing the resist film includes irradiating an electron beam, light, or ions on the resist film.

14. The photomask manufacturing method according to claim 10, wherein exposing the resist film includes irradiating an electron beam, light, or ions on the resist film.

15. A semiconductor device manufacturing method comprising:
preparing a substrate including a semiconductor substrate:
forming a resist pattern on the substrate by a lithography process using a photomask, a manufacturing method of the photomask comprising preparing a substrate including a transparent substrate and a light shield film formed on the transparent substrate; forming a pattern in the light shield film by a pattern forming method, the pattern forming method comprising forming a resist film on a main surface of a substrate; exposing the resist film to form a latent image of a pattern on the resist film; developing the resist film by flowing a developing solution on the resist film to form a resist pattern, the developing the resist film comprising partitioning the main surface of the substrate into M ($\geq 2$) regions and determining a correction exposure dose for each of the M regions, the determining the correction exposure dose including determining a correction exposure dose for an i-th ($1 \leq i \leq M$) region so that an actual pattern dimension of a pattern on the i-th region matches a design pattern dimension based on a pattern opening ratio of a pattern located on an upstream region which is further upstream than the i-th region along a flow direction of the developing solution; and etching the light shield film using the resist pattern as a mask.

16. A computer program product configured to store program instructions for execution on a computer system enabling the computer system to perform instructions for determining an exposure dose of a resist film in a pattern forming method, the pattern forming method comprising forming a resist film on a main surface of a substrate; exposing the resist film to form a latent image of a pattern on the resist film; developing the resist film by flowing a developing solution on the resist film to form a resist pattern; and forming a pattern on the substrate by etching the substrate using the resist pattern as a mask;

the instructions for determining exposure dose comprising:

an instruction for partitioning the main surface of the substrate into M ($\geq 2$) regions, and an instruction for determining a correction exposure dose for an i-th ($1 \leq i \leq M$) region so that an actual pattern dimension of a pattern on the i-th region matches a design pattern dimension based on a pattern opening ratio of a pattern located on an upstream region which is further upstream than the i-th region along a flow direction of a-flew-of the developing solution.

* * * * *

UNITED STATES PATENT AND TRADEMARK OFFICE
CERTIFICATE OF CORRECTION

PATENT NO. : 7,608,368 B2
APPLICATION NO. : 11/342677
DATED : October 27, 2009
INVENTOR(S) : Sakurai et al.

Page 1 of 1

It is certified that error appears in the above-identified patent and that said Letters Patent is hereby corrected as shown below:

Column 16, line 57, change "substrate:" to --substrate;--.

Column 18, line 17, change "of a-flew-of the" to --of the--.

Signed and Sealed this

Nineteenth Day of January, 2010

David J. Kappos
*Director of the United States Patent and Trademark Office*